United States Patent [19]
Corella, II et al.

[11] Patent Number: 5,750,087
[45] Date of Patent: May 12, 1998

[54] PROCESS FOR THE REDUCTION OF COPPER OXIDE

[75] Inventors: Joseph A. Corella, II, Zelienople; Kevin M. Neigh, Butler, both of Pa.

[73] Assignee: Mine Safety Appliances Company, Pittsburgh, Pa.

[21] Appl. No.: 673,201

[22] Filed: Jun. 27, 1996

[51] Int. Cl.$^6$ .................................................. C01G 3/02
[52] U.S. Cl. .................................................. 423/604
[58] Field of Search .................................................. 423/604

[56] References Cited

U.S. PATENT DOCUMENTS

| | | | |
|---|---|---|---|
| 4,642,161 | 2/1987 | Akahoshi et al. | 156/630 |
| 5,059,243 | 10/1991 | Jagannathan et al. | 106/1.26 |
| 5,472,563 | 12/1995 | Kogawa et al. | 156/629.1 |

FOREIGN PATENT DOCUMENTS 552830  7/1993  European Pat. Off. .

OTHER PUBLICATIONS

CA 1993: 245776, Tanno et al, Manufacture of Multilayer Printed Wiring Boards, Mar. 15, 1991.

*Primary Examiner*—Ferris Lander
*Attorney, Agent, or Firm*—James G. Uber; Henry E. Bartony, Jr.

[57] ABSTRACT

The present invention provides a method of reducing copper oxide to improve its acid resistance comprising the step of reacting cupric oxide with a reducing agent selected from the group consisting of morpholine borane, ethylene diamine borane, ethylene diamine bisborane, t-butylamine borane, piperazine borane, imidazole borane, and methoxyethylamine borane to form cuprous oxide.

20 Claims, No Drawings

5,750,087

1

PROCESS FOR THE REDUCTION OF COPPER OXIDE

FIELD OF THE INVENTION

The present invention relates to a method for the reduction of copper oxide, and, particularly, to a method for reducing copper oxide to improve acid resistance.

BACKGROUND OF THE INVENTION

A variety of methods have been investigated concerning the surface treatment of copper before bonding a resin to the copper. Under some methods, the surface of a copper printed circuit was chemically treated or polished to form a suitable extent of microscopic irregularities as a pretreatment prior to solder resist printing to improve the bonding strength between the solder resist and the copper circuit. In such treatments, however, there was a problem of copper migration generating electrolytic corrosion deposits, often in the form of dendrites, which results in reduction of the intracircuit spacing. This problem, in turn, led to reduced intracircuit insulation resistance.

Because sufficient bonding strength between a metal and a resin generally cannot be secured by directly bonding the resin onto the smooth and even surface of the metal, an oxide layer is often formed on the surface of the metal to improve the bonding strength. Accordingly, investigations have been made on a copper surface treatment method in which an oxide layer of cupric oxide (CuO), cuprous oxide ($Cu_2O$), or the like is formed on the surface of copper to improve its bonding strength. Unfortunately, some metallic oxides are readily hydrolyzed upon contact with an aqueous acidic solution and become dissolved therein as metallic ions.

A number of studies have shown, however, that acid resistance is improved by first forming cupric oxide on the surface of the copper and subsequently reducing the cupric oxide to cuprous oxide. In general, cuprous oxide is less soluble in an acid than cupric oxide. A number of methods of reducing cupric oxide to cuprous oxide have been developed. In U.S. Pat. No. 4,642,161, for example, a solution containing at least one reducing agent represented by the general formula $BH_3NHRR'$, wherein R and R" are each selected from the group consisting of H, $CH_3$ and $CH_2CH_3$, is used to reduce cupric oxide. The most commonly practiced method of reducing cupric oxide to form cuprous oxide, however, is by use of the reducing agent dimethylamine borane (DMAB), which has the formula $(CH_3)_2NH \cdot BH_3$. See Japanese Patent Application No. 1 219,483 (1989).

Unfortunately, current methods for the reduction of cupric oxide to form cuprous oxide suffer from a number of significant drawbacks. In general, DMAB and other reducing agents for such a reaction exhibit poor thermal stability and decompose rapidly whenever their temperature reaches a level of approximately 40° C. to 50° C. Moreover, these compounds are often very noxious. Further, the pH for reduction reactions with such compounds typically must be maintained in the limited range of 12 to 13 to prevent hydrolysis of the reducing agent.

It is, therefore, very desirable to develop a method of reducing cupric oxide to form cuprous oxide which reduces or eliminates these and other drawbacks associated with current methods. cl SUMMARY OF THE INVENTION In general, the present invention provides a method of treating copper oxide comprising the step of reacting the cupric oxide with a reducing agent selected from the group consisting of morpholine borane ($C_4H_{12}BNO$), ethylene diamine borane ($H_2NCH_2CH_2NH_2 \cdot BH_3$), ethylene diamine bisborane ($H_2NCH_2CH_2NH_2 \cdot 2BH_3$), t-butylamine borane (($CH_3)_3CNH_2 \cdot BH_3$), piperazine borane ($C_4H_{10}N_2 \cdot BH_3$), imidazole borane ($C_3H_4N_2 \cdot BH_3$) and methoxyethylamine borane ($C_3H_9NO \cdot BH_3$). Most preferably, the reducing agent is morpholine borane.

The reducing agents of the present invention have been discovered to provide a number of significant advantages over the various reducing agents currently used in the reduction of cupric oxide to cuprous oxide, and particularly over DMAB. For example, the thermal stabilities of the reducing agents of the present invention are much better than current reducing agents. The reducing agents of the present invention can also react at a very broad temperature range without thermal decomposition. Preferably, the reaction temperature is in the range of approximately 3° C. to approximately 95° C. Reaction at elevated temperatures using the reducing agents of the present invention may decrease the process time over current procedures.

Moreover, reducing agents of the present invention are relatively odor free, making handling thereof less noxious. Likewise, the pH value of the aqueous solutions of the reducing agents of the present invention can range from approximately 4 to approximately 14. Preferably, the pH ranges from approximately 7 to approximately 13. The concentration range of the reducing agent in the reaction solution is preferably in the range of 0.1 wt % to the solubility limit of the reducing agent in the solvent. More preferably, the concentration range of the reducing agent in the reaction solution is in the range of 0.3 wt % to the solubility limit of the reducing agent in the solvent. As used herein, wt % is defined as follows:

$$\frac{\text{weight of reducing agent}}{(\text{weight of reducing agent} + \text{weight of solvent})} \times 100\%$$

DETAILED DESCRIPTION OF THE INVENTION

Copper oxide (cupric oxide) was formed on copper test coupons via well known methods described in the literature or through the use of commercial pre-formulated solutions. The weight gain of the oxide coating was typically in the range of approximately 0.30 to 0.50 mg/cm². The process cycle included an alkaline soak, water rinse, neutralization, water rinse, sodium hydroxide treatment, and copper oxide treatment. The copper oxide immersion time ranged from 4 to 6 minutes at approximately 160° to 170° F.

Aqueous solutions of the reducing agents of the present invention and deionized water were prepared in a concentration ranging from approximately 1 g/L (1 gram/liter of solution or 0.1 wt %) and higher. Preferably, the concentration of reducing agent was in the range of approximately 0.1 wt % to the solubility limit of the reducing agent. In the case of morpholine borane, the concentration of the reducing agent is more preferably in the range of approximately 1 to approximately 20 gm/L (that is, approximately 0.1 wt % to approximately 2.0 wt %).

Preferably, the pH of the solution is in the range of approximately 5 to approximately 13. More preferably, the pH of the solution is in the range of approximately 7 to approximately 13. The pH of the solution was adjusted with sodium hydroxide. The reaction temperature is preferably in the range of approximately 3° C. to approximately 95° C. More preferably, the reaction temperature is in the range of approximately 20° C. to approximately 50° C. A number of protic solvents other than water including alcohols (for example, methanol) are suitable for the reactions of the present invention.

During the reduction reaction, cupric oxide coated test coupons were immersed in a reducing agent solution as described above. Vigorous bubbling occurred rapidly upon contact with the reducing agent solution. The test coupons were typically immersed for approximately 3 to 10 minutes. The coupon surface was observed to change color from the "black" oxide coating to a uniform brown appearance, indicating the reduction of cupric oxide to cuprous oxide.

Subsequent to the reducing reaction, the coupons were rinsed and immersed in 3 molar HCL. The color of the coupon remained the same, indicating it was completely resistant to the aqueous acid solution. A summary of the results of several experiments performed with morpholine borane over a range of conditions are set forth in Table 1 below.

TABLE 1

| Concentration of Morpholine Borane (gm/L $H_2O$) | Temperature (°C.) | pH | Acid Resistant Coating |
|---|---|---|---|
| 80 | 25 | 7 | yes |
| 80 | 25 | 13 | yes |
| 80 | 32 | 7 | yes |
| 80 | 32 | 13 | yes |
| 10 | 25 | 7 | yes |
| 10 | 25 | 13 | yes |
| 10 | 32 | 7 | yes |
| 10 | 32 | 13 | yes |
| 10 | 25 | 4 | yes |
| 10 | 50 | 4 | yes |
| 10 | 50 | 14 | yes |
| 10 | 4 | 7 | yes |
| 10 | 50 | 7 | yes |
| 10 | 90 | 7 | yes |
| 10 | 24 | 4 | yes |
| 10 | 25 | 14 | yes |
| 3 | 25 | 7 | yes |

Table 2 below summarizes several studies performed on compounds other than morpholine borane.

TABLE 2

| Compound | Conc. (wt %) | Temp. (°C.) | pH | Acid Resistance | Appearance |
|---|---|---|---|---|---|
| piperazine borane | 1.0 | 23 | 7-8 | Yes | Medium brown oxide |
| ethylenediamine diamine borane | 1.0 | 24 | 7-8 | Yes | Medium brown oxide |
| ethylenediamine bisborane | 0.75 | 24 | 7-8 | Yes | Dark brown oxide |
| imidazole borane | 1.0 | 24 | 7-8 | Yes | Dark brown oxide |
| methoxyethylamine borane | 1.0 | 23 | 7-8 | Yes | Medium brown oxide |

Although the present invention has been described in detail in connection with the above examples, it is to be understood that such detail is solely for that purpose and that variations can be made by those skilled in the art without departing from the spirit of the invention except as it may be limited by the following claims.

What is claimed is:

1. A method of reducing copper oxide comprising the step of reacting the copper oxide with a reducing agent selected from the group consisting of morpholine borane, ethylene diamine borane, ethylene diamine bisborane, t-butylamine borane, piperazine borane, imidazole borane, and methoxyethylamine borane.

2. The method of claim 1 wherein the reaction occurs in a solution of the reducing agent wherein the concentration of the reducing agent is in the range of approximately 0.1 wt % to the solubility limit of the reducing agent.

3. The method of claim 2 wherein the concentration of the reducing agent is in the range of approximately 0.3 wt % to the solubility limit of the reducing agent.

4. The method of claim 1 wherein the reaction occurs at temperature in the range of approximately 3° C. to approximately 95° C.

5. The method of claim 4 wherein the reaction occurs at temperature in the range of approximately 20° C. to approximately 50° C.

6. The method of claim 1 wherein the solvent comprises water and the pH of the solution is in the range of approximately 4 to approximately 14.

7. The method of claim 6 wherein the pH of the solution is in the range of approximately 5 to approximately 13.

8. The method of claim 7 wherein the pH of the solution is in the range of approximately 7 to approximately 13.

9. The method of claim 2 wherein reducing agent is morpholine borane.

10. The method of claim 9 wherein concentration of the morpholine borane is in the range of approximately 0.1 wt % to 2.0 wt %.

11. A method of reducing cupric oxide to cuprous oxide comprising the step of reacting the copper oxide with a reducing agent selected from the group consisting of morpholine borane, ethylene diamine borane, ethylene diamine bisborane, t-butylamine borane, piperazine borane, imidazole borane, and methoxyethylamine borane.

12. The method of claim 11 wherein the reaction occurs in a solution of the reducing agent wherein the concentration of the reducing agent is in the range of approximately 0.1 wt % to the solubility limit of the reducing agent.

13. The method of claim 12 wherein the concentration of the reducing agent is in the range of approximately 0.3 wt % to the solubility limit of the reducing agent.

14. The method of claim 11 wherein the reaction occurs at temperature in the range of approximately 3° C. to approximately 95° C.

15. The method of claim 14 wherein the reaction occurs at temperature in the range of approximately 20° C. to approximately 50° C.

16. The method of claim 11 wherein the solvent comprises water and the pH of the solution is in the range of approximately 4 to approximately 14.

17. The method of claim 16 wherein the pH of the solution is in the range of approximately 5 to approximately 13.

18. The method of claim 17 wherein the pH of the solution is in the range of approximately 7 to approximately 13.

19. The method of claim 12 wherein reducing agent is morpholine borane.

20. The method of claim 19 wherein concentration of the morpholine borane is in the range of approximately 0.1 wt % to 2.0 wt %.

* * * * *

REEXAMINATION CERTIFICATE (3957th)

United States Patent
Corella, II et al.

[11] B1 5,750,087
[45] Certificate Issued Dec. 14, 1999

[54] PROCESS FOR THE REDUCTION OF COPPER OXIDE

[75] Inventors: Joseph A. Corella, II, Zelienople; Kevin M. Neigh, Butler, both of Pa.

[73] Assignee: Mine Safety Appliances Company, Pittsburgh, Pa.

Reexamination Request:
No. 90/005,084, Aug. 25, 1998

Reexamination Certificate for:
Patent No.: 5,750,087
Issued: May 12, 1998
Appl. No.: 08/673,201
Filed: Jun. 27, 1996

[51] Int. Cl.⁶ .................................................. C01G 3/02
[52] U.S. Cl. ........................ 423/604; 427/299; 427/399
[58] Field of Search ........................ 423/604; 427/328, 427/299, 399

[56] References Cited

U.S. PATENT DOCUMENTS

| | | | |
|---|---|---|---|
| 4,642,161 | 2/1987 | Akahoshi et al. | 156/630 |
| 5,721,014 | 2/1998 | Fakler et al. | 427/299 |
| 5,753,309 | 5/1998 | Fakler et al. | 427/399 |

FOREIGN PATENT DOCUMENTS

| | | | |
|---|---|---|---|
| 3-82187 | 4/1991 | Japan | 427/299 |

OTHER PUBLICATIONS

The Condensed Chemical Dictionary, Tenth Edition, Van Nostrand Reinhold Company, 1981, p. 899.

*Primary Examiner*—N. M. Nguyen

[57] ABSTRACT

The present invention provides a method of reducing copper oxide to improve its acid resistance comprising the step of reacting cupric oxide with a reducing agent selected from the group consisting of morpholine borane, ethylene diamine borane, ethylene diamine bisborane, t-butylamine borane, piperazine borane, imidazole borane, and methoxyethylamine borane to form cuprous oxide.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 11 are determined to be patentable as amended.

Claims 2–10 and 12–20, dependent on an amended claim, are determined to be patentable.

1. A method of reducing [copper] *cupric* oxide *to cuprous oxide* comprising the step of reacting [the copper] *cupric* oxide with a reducing agent selected from the group consisting of morpholine borane, ethylene diamine borane, ethylene diamine bisborane, t-butylamine borane, [piperazene borane,] imidazole borane, and methoxyethylamine borane *for a period of approximately 3 to approximately 10 minutes*.

11. A method of reducing cupric oxide to cuprous oxide comprising the step of reacting [the copper] *cupric* oxide with a reducing agent selected from the group consisting of morpholine borane, ethylene diamine borane, ethylene diamine bisborane, t-butylamine borane, [piperazene borane,] imidazole borane, and methoxyethylamine borane.

\* \* \* \* \*